United States Patent
Tan et al.

(10) Patent No.: US 7,109,099 B2
(45) Date of Patent: Sep. 19, 2006

(54) END OF RANGE (EOR) SECONDARY DEFECT ENGINEERING USING SUBSTITUTIONAL CARBON DOPING

(75) Inventors: Chung Foong Tan, Singapore (SG); Jinping Liu, Singapore (SG); Hyeok Jae Lee, Singapore (SG); Bangun Indajang, Singapore (SG); Eng Fong Chor, Singapore (SG); Shiang Yang Ong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 59 days.

(21) Appl. No.: 10/688,047

(22) Filed: Oct. 17, 2003

(65) Prior Publication Data
US 2005/0085055 A1   Apr. 21, 2005

(51) Int. Cl.
*H01L 21/425* (2006.01)
*H01L 21/36* (2006.01)
*H01L 21/20* (2006.01)
*H01L 21/265* (2006.01)

(52) U.S. Cl. .................. 438/527; 438/481; 438/492; 438/301; 438/514; 438/519

(58) Field of Classification Search ............ 438/481, 438/492, 503, 507, 301, 514, 519, 523, 527, 438/931
See application file for complete search history.

(56) References Cited

U.S. PATENT DOCUMENTS

| | | | |
|---|---|---|---|
| 6,198,157 B1 * | 3/2001 | Ishida et al. | 257/607 |
| 6,358,806 B1 * | 3/2002 | Puchner | 438/308 |
| 6,492,216 B1 * | 12/2002 | Yeo et al. | 438/197 |
| 6,514,886 B1 | 2/2003 | U'Ren | 438/791 |
| 6,541,829 B1 | 4/2003 | Nishinohara et al. | 257/402 |
| 6,576,535 B1 * | 6/2003 | Drobny et al. | 438/507 |
| 6,743,704 B1 * | 6/2004 | Takahashi | 438/559 |
| 6,830,980 B1 * | 12/2004 | Mansoori et al. | 438/308 |
| 2002/0033511 A1 * | 3/2002 | Babcock et al. | 257/408 |

OTHER PUBLICATIONS

"Optimum Halo Structure for Sub-0.1 μm CIMOS FETs", Wen-Kuan Yeh et al., *IEEE Trans. on Electron Devices*, vol. 48, No. 10, Oct. 2001, pp. 2357-2362.

"Antimony Assisted Arsenic SID Extension Engineering for Sub-0.1 μm nMOSFETS: A Novel Approach to Steep and Retrograde Indium Pocket Profiles," Howard C.H. Wang et al., *IEDM 2001*.

"Effects of end-of-range dislocation loops on transient enhanced diffusion of indium implanted in silicon", T. Noda et al, *Journal of APplied Physics*, vol. 88, No. 9, Nov. 2001, pp. 4980-4984.

(Continued)

*Primary Examiner*—Maria F. Guerrero

(57) ABSTRACT

A method for incorporating carbon into a wafer at the interstitial a-c silicon interface of the halo doping profile is achieved. A bulk silicon substrate is provided. A carbon-doped silicon layer is deposited on the bulk silicon substrate. An epitaxial silicon layer is grown overlying the carbon-doped silicon layer to provide a starting wafer for the integrated circuit device fabrication. An integrated circuit device is fabricated on the starting wafer by the following steps. A gate electrode is formed on the starting wafer. LDD and source and drain regions are implanted in the starting wafer adjacent to the gate electrode. Indium is implanted to form halo implants adjacent to the LDD regions and underlying the gate electrode wherein the halo implants extend to an interface between the epitaxial silicon layer and the carbon-doped silicon layer wherein carbon ions in the carbon-doped silicon layer act as a silicon interstitial sink for silicon interstitials formed by the halo implants to prevent end of range secondary defect formation.

20 Claims, 2 Drawing Sheets

OTHER PUBLICATIONS

"Enhanced electrical activation of indium coimplanted with carbon in a silicon substrate," H. Boudinov et al., *Journal of Applied Physics*, vol. 86, No. 10, pp. 5909-5911, Nov. 15, 1999.

"Indium transient enhanced diffusion," P.B. Griffin et al., *Applied Physics Letters*, vol. 73, No. 20, pp. 2986-2988, Nov. 16, 1998.

"Evolution of end-of-range damage and transient enhanced diffusion of indium in silicon," T. Noda, *Journal of Applied Physics*, vol. 91, No. 2, pp. 639-645, Jan. 15, 2002.
eb;normal "Suppression of dislocation formation in silicon by carbon implantion," T.W. Simpson et al, *Appl. Physics Letters*, 67 (19), Nov. 6, 1995, pp. 2857-2859.

"Elimination of secondary defects in premorphized Si by $C^+$ implantation," Satoshi Mishikawa et al., *Applied Physics Letters*, 62(3), Jan. 18, 1993, pp. 303-305.

"Removal of end of range defect in $Ge^+$ pre-amorphized Si by carbon ion implantation," Peng-Shiu Chen et al., *Jrnl of Applied Physics*, vol. 85, No. 6, Mar. 15, 1999, pp. 3114-3119.

* cited by examiner

END OF RANGE (EOR) SECONDARY DEFECT ENGINEERING USING SUBSTITUTIONAL CARBON DOPING

BACKGROUND OF THE INVENTION (1) Field of the Invention

The present invention relates to the fabrication of integrated circuit devices, and more particularly, to a method of reducing secondary defect formation due to indium halo doping in the fabrication of integrated circuits.

(2) Description of the Prior Art

Halo or pocket implants are made in the fabrication of integrated circuits in order to suppress n-channel and p-channel short channel effects, to suppress drain-induced-barrier-lowering, and to suppress high electrical field regions that could cause punchthrough phenomenon. The use of heavy ions (e.g. antimony or indium) as a dopant for the halo pocket of the nMOSFET becomes more important with the shrinkage of the nMOS transistor to below the sub-0.1 µm regime. See "Optimum Halo Structure for Sub-0.1 µm CMOSFETs", Wen-Kuan Yeh, *IEEE Transaction on Electron Devices*, Vol. 48, No. 10, October 2001 and "Antimony Assisted Arsenic S/D Engineering for sub-0.1 µm nMOSFETs: A Novel approach to steep and retrograde indium pocket profiles," Howard C. H. Wang, *IEDM* 2001.

Indium, as a heavy ion, allows implantation to be carried out at higher energy with smaller profile spread, providing better process control. The indium ion has large cross-sectional area and, when implanted at high energy, causes much damage to the silicon lattices compared to its boron counterpart. (See "Effect of End of Range on transient Enhanced Diffusion of Indium Implanted in Silicon", T. Noda, *Journal of Applied Physics*, Vol. 88, No. 9, 1 Nov. 2001.) This causes formation of the End of Range (EOR) secondary defect at the tail end of the profile upon insufficient annealing. A prolonged soak anneal would cause unnecessary dopant diffusion, undesirable for shallow junction formation. EOR defects when present in the depletion region of the PN junction cause severe junction leakage. Additional issues related to the indium ion include low dopant activation (see "Enhanced electrical activation of indium coimplanted with carbon in a silicon substrate", H. Noudinov, *Journal of Applied Physics*, Vol. 86, No. 10, p. 5909, 15 Nov. 1999) and transient enhanced diffusion (TED) (see "Indium Transient Enhanced Diffusion", P. B. Griffin, *Applied Physics Letters*, Vol. 73, No 20, p. 2986, 16 Nov. 1998 and "Evolution of end of range damage and transient enhanced diffusion of indium in silicon", T. Noda, *Journal of Applied Physics*, Vol. 91, No. 2, p. 639, 15 Jan. 2002).

Reports have shown that with the incorporation of carbon into the amorphous-crystalline silicon interface of the dopant implant profile, EOR secondary defects can be removed. This interface is an area or region at the tail end of the implant profile which maintains its crystalline property, but it is saturated with the dopant impurity. (See "Elimination of secondary defects in preamorphized Si by C+ implantation", Satoshi Nishikawa, *Applied Physics Letters*, 62(3), 18 Jan. 1993 and "Removal of end of range defect in Ge+ pre-amorphized Si by carbon ion implantation", Peng-Shiu Chen, *Journal of Applied Physics*, Vol. 85, No. 6, 15 Mar. 1999). A common method of introducing carbon into the amorphous-crystalline silicon is through carbon co-implantation with dopant ions. Substitutional carbon was shown to act as a sink for silicon interstitials formed, preventing the clustering of silicon interstitials, thereby preventing EOR secondary defect formation. (See "Suppression of dislocation formation in silicon by carbon implantation", T. W. Simpson, *Applied Physics Letters*, 67(19), 6 Nov. 1995). The implantation of carbon itself introduces additional silicon interstitials, reducing the effectiveness of carbon as a sink.

U.S. Pat. No. 6,541,829 to Nishinohara et al discloses an indium halo implant. U.S. Pat. No. 6,514,886 to U'Ren teaches an RPCVD method prior to epitaxy.

SUMMARY OF THE INVENTION

Accordingly, a primary object of the invention is to provide a method to prevent formation of EOR secondary defects in the fabrication of integrated circuits.

A further object of the invention is to provide a method to prevent formation of EOR secondary defects in connection with an indium halo implant.

Another object of the invention is to provide a method to prevent formation of EOR secondary defects in connection with an indium halo implant through the presence of substitutional carbon acting as a silicon interstitial sink.

Yet another object of the invention is to provide a method to prevent transient enhanced diffusion of indium in connection with an indium halo implant.

Yet another object of the invention is to provide a method to prevent transient enhanced diffusion of indium in connection with an indium halo implant through the presence of substitutional carbon acting as a silicon interstitial sink.

A still further object of the invention is to provide a method to enhance electrical activation of indium in connection with an indium halo implant.

Yet another object of the invention is to provide a method to enhance electrical activation of indium in connection with an indium halo implant through a reduced pressure chemical vapor deposition (RPCVD) of carbon process.

Yet another object of the invention is to provide a method to prevent transient enhanced diffusion of indium in connection with an indium halo implant through a reduced pressure chemical vapor deposition (RPCVD) of carbon process.

Another object of the invention is to provide a method to prevent formation of EOR secondary defects in connection with an indium halo implant through a reduced pressure chemical vapor deposition (RPCVD) of carbon process.

In accordance with the objects of the invention, a method for incorporating carbon into a wafer at the interstitial a-c silicon interface of the halo doping profile is achieved. A bulk silicon substrate is provided. A carbon-doped silicon layer is deposited on the bulk silicon substrate. An epitaxial silicon layer is grown overlying the carbon-doped silicon layer to provide a starting wafer for the integrated circuit device fabrication. An integrated circuit device is fabricated on the starting wafer by the following steps. A gate electrode is formed on the starting wafer. LDD and source and drain regions are implanted in the starting wafer adjacent to the gate electrode. Antimony or Indium is implanted to form halo implants adjacent to the LDD regions and underlying the gate electrode wherein the halo implants extend to an interface between the epitaxial silicon layer and the carbon-doped silicon layer wherein carbon ions in the carbon-doped silicon layer act as a silicon interstitial sink for silicon interstitials formed by the halo implants to prevent end of range secondary defect formation.

Also in accordance with the objects of the invention, an integrated circuit having a substitutional carbon layer at the interstitial amorphous-crystalline silicon interface of the halo doping profile is achieved. The integrated circuit device comprises a starting wafer comprising a bulk silicon substrate, a carbon-doped silicon layer overlying the bulk silicon substrate, and an epitaxial silicon layer overlying the carbon-doped silicon layer. On the starting wafer is a gate electrode. LDD and source and drain regions lie in the starting wafer adjacent to the gate electrode. Indium halo implants lie adjacent to the LDD regions and underlying the gate electrode wherein the halo implants extend to an interface between epitaxial silicon layer and carbon-doped silicon layer wherein carbon ions in carbon-doped silicon layer act as a silicon interstitial sink for silicon interstitials formed by the halo implants to prevent end of range secondary defects.

BRIEF DESCRIPTION OF THE DRAWINGS

In the accompanying drawings forming a material part of this description, there is shown.

DESCRIPTION OF THE PREFERRED EMBODIMENTS

The present invention introduces a layer of substitutional carbon to the tail end of the halo doping profile in order to reduce the secondary defect formation due to the indium halo doping implantation. It is a simple process, yet superior to carbon co-implantation as no additional implant damage is introduced through this method.

Figure 4:
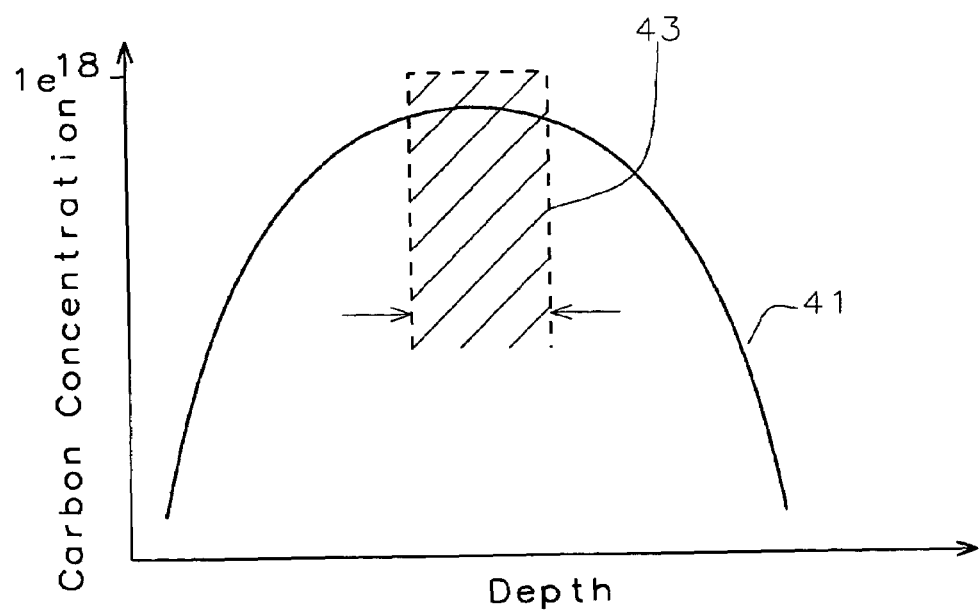
FIG. 4 is a graphical representation of a carbon implanted profile of the prior art compared to that of the present invention.

A carbon implant by itself would inherently cause damage at the tail end of the implantation profile. This causes additional damage which can be avoided if the carbon is doped using the CVD method. Carbon doped by this method is substitutional and does not require an additional annealing process. FIG. 4 illustrates the carbon implant profile 41 of the prior art methods where carbon is implanted into silicon. The profile 41 is a skewed gaussian-like distribution. Moreover, the smaller carbon atoms diffuse very fast making it difficult to control the profile. Using the RPCVD method of the present invention, a much more precise and accurate doping profile is obtained, as illustrated by 43 in FIG. 4.

In the process of the present invention, a layer of substitutional carbon is introduced into the starting wafer before device fabrication. The method used is RPCVD to dope a layer of the silicon with carbon prior to growth of a silicon epitaxy layer. The carbon-doped layer is to be placed at the interstitial rich amorphous-crystalline silicon interface of the heavy ion (antimony or indium) halo doping profile in order to prevent formation of EOR secondary defects. The invention applies to both N and P MOSFETs; however, the halo dopant species for PMOSFETs is usually antimony, a heavy ion.

Figure 1:
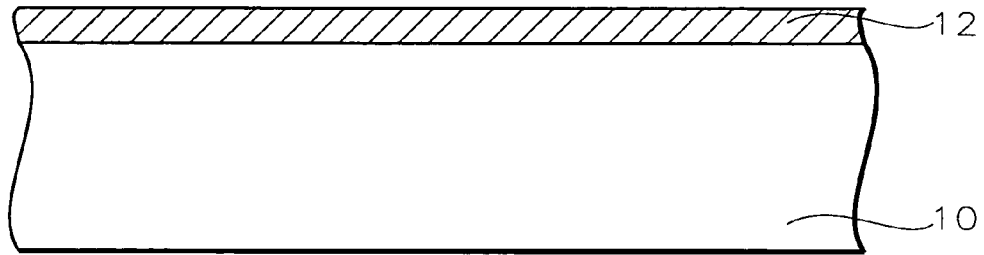
FIGS. 1 through 3 are cross-sectional representations of a preferred embodiment of the present invention.

Referring now more particularly to FIG. 1, there is shown a bulk silicon semiconductor substrate 10. In a key step of the present invention, a layer of carbon-doped silicon 12 is deposited on the bulk silicon wafer by chemical vapor deposition (CVD), or preferably, by reduced pressure CVD (RPCVD) to a thickness of between about 100 to 700 Angstroms. The percentage of carbon in the silicon layer 12 is up to about 0.5%.

Figure 2:
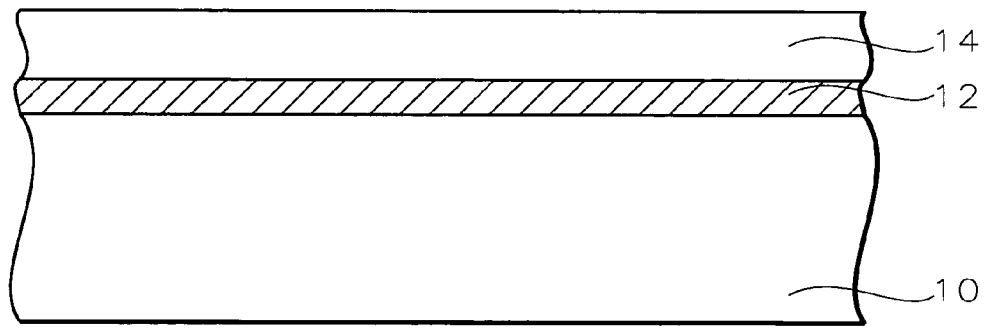

Referring now to FIG. 2, a crystalline silicon layer 14 is grown by epitaxy over the carbon-doped layer 12 to a thickness of between about 300 and 500 Angstroms. The thickness of the silicon layer 14 is controlled to be the thickness of the shallow junction formation region. Ideally, the halo implants will be formed to the depth of the carbon-doped layer.

This completes formation of the starting wafer according to the process of the present invention. Now semiconductor device structures are fabricated in and on the wafer according to conventional methods.

Figure 3:
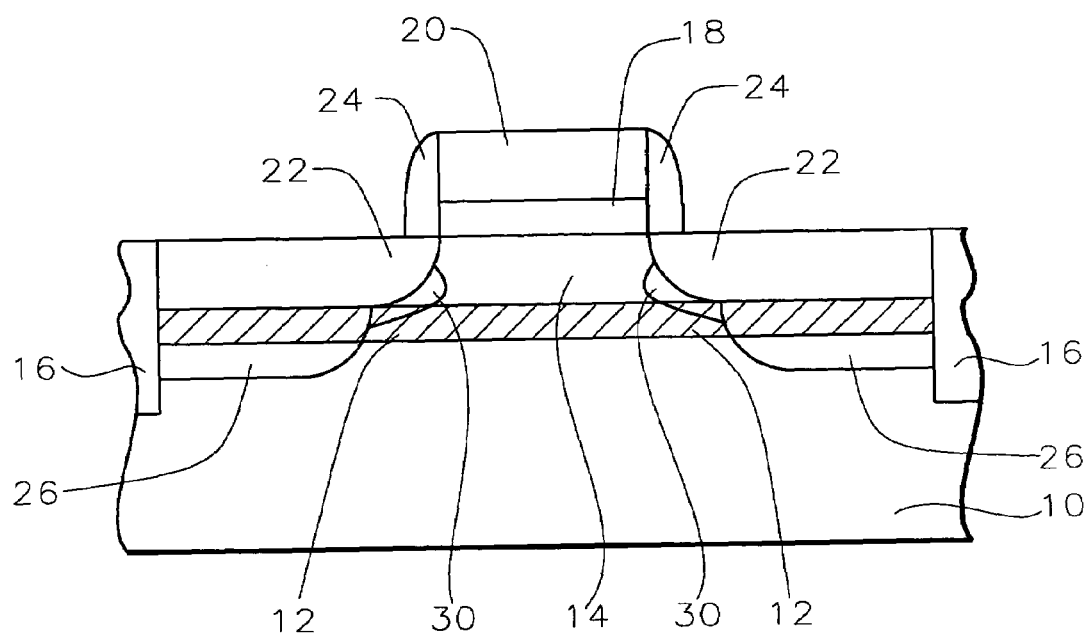

For example, referring to FIG. 3, shallow trench isolation (STI) regions 16 may be formed in the substrate to separate active areas. A thermal gate oxide layer 18 is grown on the surface of the substrate. A gate material layer, such as polysilicon, is deposited overlying the gate oxide layer and patterned to form the gate electrode 20.

Lightly doped source and drain regions (LDD) 22 are formed within the substrate adjacent to the gate electrode. Spacers 24 are formed on the sidewalls of the gate electrode and source and drain regions 26 are formed in the substrate. The source and drain regions extend through the carbon-doped layer 12 and into the underlying bulk silicon substrate 10.

Now, the heavy ions (e.g. indium or antimony) are implanted into the silicon layer 14 to form the halo regions 30. The carbon-doped layer 12 acts as a silicon interstitial sink to prevent the formation of EOR secondary defects. The carbon-doped layer 12 also prevents the transient enhanced diffusion (TED) of dopants which diffuses as through an interstitially enhanced mechanism. This also applies to other dopants such as boron and phosphorus. Diffusion is affected mainly by high temperature steps. As the presence of the substitutional carbon digests the available interstitials, enhanced diffusion of the dopant which diffuses through an interstitial mechanism is suppressed. This allows for improved reverse short channel effects of the MOSFET. Indium normally has a very low electrical activation of 0.5%, but when co-implanted with carbon, the electrical activation of indium can be improved to 30–50%. Substitutional carbon is even more effective in improving indium activation than co-implantation.

The halo implants are exactly at the carbon layer, but they may lie anywhere from the base of the LDD regions 22 to the EOR of the halo.

The process of the present invention reduces EOR defects, prevents transient enhanced diffusion of heavy ions, and improves electrical activation of dopants in a heavy ion halo process by forming a CVD carbon-doped silicon layer on a bulk silicon layer and underlying an epitaxial silicon layer to form a starting wafer. The carbon-doped silicon layer is placed at the interstitial rich amorphous-crystalline silicon interface of the heavy ion halo doping profile.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing a bulk silicon substrate;

depositing a carbon-doped silicon layer on said bulk silicon substrate;

growing an epitaxial silicon layer overlying said carbon-doped silicon layer to provide a starting wafer for integrated circuit fabrication; and fabricating said integrated circuit device on said starting wafer by the steps comprising:

forming a gate electrode on said starting wafer;

implanting LDD regions within said epitaxial silicon layer adjacent to said gate electrode;

implanting source and drain regions within said epitaxial silicon layer adjacent to said gate electrode and extending through said carbon-doped silicon layer into said bulk silicon substrate; and implanting a heavy ion to form halo implants within said epitaxial silicon layer adjacent to said LDD regions and underlying said gate electrode wherein said halo implants extend downward through said epitaxial silicon layer to an interface between said epitaxial silicon layer and said carbon-doped silicon layer.

2. The method according to claim 1 wherein said carbon-doped silicon layer is deposited by reduced pressure chemical vapor deposition.

3. The method according to claim 1 wherein said carbon-doped silicon layer has a thickness of between about 100 and 200 Angstroms.

4. The method according to claim 1 wherein said carbon-doped silicon layer has a carbon content of up to 0.5% atomic percent.

5. The method according to claim 1 wherein said epitaxial silicon layer has a thickness of between about 300 and 400 Angstroms.

6. The method according to claim 1 wherein carbon ions in said carbon-doped silicon layer act as a silicon interstitial sink for silicon interstitials formed by said halo implants to prevent end of range secondary defect formation.

7. The method according to claim 1 wherein said heavy ions comprise antimony or indium.

8. A method of fabricating an integrated circuit device comprising:

providing a bulk silicon substrate;

depositing a carbon-doped silicon layer on said bulk silicon substrate;

growing an epitaxial silicon layer overlying said carbon-doped silicon layer to provide a starting wafer for said integrated circuit device fabrication; and fabricating said integrated circuit device on said starting wafer by the steps comprising:

forming a gate electrode on said starting wafer;

implanting LDD regions in said starting wafer adjacent to said gate electrode;

implanting source and drain regions within said epitaxial silicon layer adjacent to said gate electrode and extending through said carbon-doped silicon layer into said bulk silicon substrate; and implanting antimony or indium ions within said epitaxial silicon layer to form halo implants adjacent to said LDD regions and underlying said gate electrode wherein said halo implants extend downward through said epitaxial silicon layer to an interface between said epitaxial silicon layer and said carbon-doped silicon layer.

9. The method according to claim 8 wherein said carbon-doped silicon layer is deposited by chemical vapor deposition.

10. The method according to claim 8 wherein said carbon-doped silicon layer is deposited by reduced pressure chemical vapor deposition.

11. The method according to claim 8 wherein said carbon-doped silicon layer has a thickness of between about 100 and 700 Angstroms.

12. The method according to claim 8 wherein said carbon-doped silicon layer has a carbon content of up to 0.5% atomic percent.

13. The method according to claim 8 wherein said epitaxial silicon layer has a thickness of between about 300 and 500 Angstroms.

14. The method according to claim 8 wherein carbon ions in said carbon-doped silicon layer act as a silicon interstitial sink for silicon interstitials formed by said halo implants to prevent end of range secondary defect formation.

15. A method of fabricating an integrated circuit device comprising:

providing a bulk silicon substrate;

depositing a carbon-doped silicon layer on said bulk silicon substrate;

growing an epitaxial silicon layer overlying said carbon-doped silicon layer to provide a starting wafer for said integrated circuit device fabrication; and fabricating said integrated circuit device on said starting wafer by the steps comprising:

forming a gate electrode on said starting wafer;

implanting LDD regions within said epitaxial silicon layer adjacent to said gate electrode;

implanting source and drain regions within said epitaxial silicon layer adjacent to said gate electrode and extending through said carbon-doped silicon layer into said bulk silicon substrate; and implanting heavy ions to form halo implants within said epitaxial silicon layer adjacent to said LDD regions and underlying said gate electrode wherein said halo implants extend downward through said epitaxial silicon layer to an interface between said epitaxial silicon layer and said carbon-doped silicon layer wherein carbon ions in said carbon-doped silicon layer act as a silicon interstitial sink for silicon interstitials formed by said halo implants to prevent end of range secondary defect formation.

16. The method according to claim 15 wherein said carbon-doped silicon layer is deposited by reduced pressure chemical vapor deposition.

17. The method according to claim 15 wherein said carbon-doped silicon layer has a thickness of between about 100 and 700 Angstroms.

18. The method according to claim 15 wherein said carbon-doped silicon layer has a carbon content of up to 0.5% atomic percent.

19. The method according to claim 15 wherein said epitaxial silicon layer has a thickness of between about 300 and 500 Angstroms.

20. The method according to claim 15 wherein said heavy ions comprise antimony or indium.

* * * * *